United States Patent
Shibata

(10) Patent No.: US 11,291,149 B2
(45) Date of Patent: Mar. 29, 2022

(54) ELECTRONIC COMPONENT MOUNTING MACHINE AND PRODUCTION LINE

(71) Applicant: FUJI CORPORATION, Chiryu (JP)

(72) Inventor: Mitsuhiko Shibata, Toyota (JP)

(73) Assignee: FUJI CORPORATION, Chiryu (JP)

( * ) Notice: Subject to any disclaimer, the term of this patent is extended or adjusted under 35 U.S.C. 154(b) by 272 days.

(21) Appl. No.: 16/072,974

(22) PCT Filed: Jan. 29, 2016

(86) PCT No.: PCT/JP2016/052623
§ 371 (c)(1),
(2) Date: Jul. 26, 2018

(87) PCT Pub. No.: WO2017/130372
PCT Pub. Date: Aug. 3, 2017

(65) Prior Publication Data
US 2019/0029152 A1   Jan. 24, 2019

(51) Int. Cl.
*H05K 13/04*   (2006.01)
*G01N 21/956*   (2006.01)
(Continued)

(52) U.S. Cl.
CPC ... *H05K 13/0465* (2013.01); *G01N 21/95607* (2013.01); *G05B 19/058* (2013.01);
(Continued)

(58) Field of Classification Search
CPC ........... H05K 13/0465; H05K 13/0812; H05K 13/0815; H05K 13/0817; H05K 13/083;
(Continued)

(56) References Cited

U.S. PATENT DOCUMENTS 6,775,899 B1 * 8/2004 Tomomatsu ......... H05K 3/3485
29/593
2002/0157488 A1   10/2002 Nagafuku et al.
(Continued)

FOREIGN PATENT DOCUMENTS

EP   1 239 719 A2   9/2002
EP   2 717 665 A1   4/2014
(Continued)

OTHER PUBLICATIONS

Machine Translation of JP 4-48248, May 2021 (Year: 2021).*
(Continued)

*Primary Examiner* — A. Dexter Tugbang
(74) *Attorney, Agent, or Firm* — Oblon, McClelland, Maier & Neustadt, L.L.P.

(57) ABSTRACT

An electronic component mounting machine includes an image-capturing device and a control device. The image-capturing device captures the images of sub-fiducial marks and main fiducial marks. When the control device can read the main fiducial marks from the images captured by the image-capturing device, the control device determines the mounting positions of the electronic components with respect to a substrate with reference to the main fiducial marks. On the other hand, when the main fiducial marks cannot be read from the images due to a print defect of the main fiducial marks, the control device determines the mounting positions of the electronic components with respect to the substrate with reference to the sub-fiducial marks which are the reference sources of the image-capturing positions of the main fiducial marks.

3 Claims, 4 Drawing Sheets

(51) Int. Cl.
- *H05K 13/08* (2006.01)
- *G05B 19/05* (2006.01)
- *G06T 7/00* (2017.01)
- *H05K 3/34* (2006.01)
- *H05K 3/30* (2006.01)

(52) U.S. Cl.
CPC ......... *G06T 7/001* (2013.01); *H05K 13/0812* (2018.08); *H05K 13/0815* (2018.08); *H05K 13/0817* (2018.08); *H05K 13/0882* (2018.08); *G06T 2207/30141* (2013.01); *H05K 3/303* (2013.01); *H05K 3/341* (2013.01); *H05K 3/3485* (2020.08); *H05K 13/083* (2018.08); *H05K 2203/163* (2013.01); *H05K 2203/165* (2013.01); *H05K 2203/166* (2013.01); *Y10T 29/49004* (2015.01); *Y10T 29/53174* (2015.01)

(58) Field of Classification Search
CPC ......... H05K 13/0882; H05K 2203/166; H05K 3/303; H05K 3/341; H05K 3/3485; H05K 2203/163; H05K 2203/165; Y10T 29/49004; Y10T 29/53174; G01N 21/95607; G05B 19/058; G06T 7/001; G06T 2207/30141

See application file for complete search history.

(56) References Cited

U.S. PATENT DOCUMENTS

| | | | |
|---|---|---|---|
| 2005/0077340 A1 | 4/2005 | Nagafuku et al. | |
| 2006/0000872 A1* | 1/2006 | Nakagawa | H05K 13/0817 228/56.5 |
| 2012/0062727 A1* | 3/2012 | Kaida | H05K 13/083 348/87 |
| 2014/0373346 A1* | 12/2014 | Okamoto | H05K 3/341 29/825 |

FOREIGN PATENT DOCUMENTS

| | | | |
|---|---|---|---|
| EP | 2 943 051 A1 | | 11/2015 |
| JP | 04048248 A | * | 2/1992 |
| JP | 2003-101300 A | | 4/2003 |
| JP | 2013-58605 A | | 3/2013 |
| JP | 2013-74064 A | | 4/2013 |
| JP | 2013068559 A | * | 4/2013 |

OTHER PUBLICATIONS

International Search Report dated May 10, 2016 in PCT/JP2016/052623 filed Jan. 29, 2016.

Japanese Office Action dated Dec. 8, 2020 in Japanese Patent Application No. 2020-031192, 4 pages.

* cited by examiner

ELECTRONIC COMPONENT MOUNTING MACHINE AND PRODUCTION LINE

TECHNICAL FIELD

The present application relates to an electronic component mounting machine for mounting electronic components on a substrate, and a production line in which a plurality of electronic component mounting machines are provided.

BACKGROUND ART

A wiring pattern is printed on a substrate. A solder portion is printed on a land portion of the wiring pattern. For example, as disclosed in Patent Literature 1, an electronic component mounting machine sometimes determines a mounting position of an electronic component with reference to a solder paste mark (solder portion). In this case, even if the solder portion is printed with being deviated from the land portion, the electronic component is mounted at a regular position with respect to the solder portion. At the time of reflow, the electronic component flows toward the center of the land portion together with the molten solder portion. Therefore, after the reflow, the electronic component can be mounted at the regular position as a result. In this manner, when the mounting position of the electronic component is determined with reference to the solder paste mark, the electronic component can be mounted at the regular position by relying on the self-alignment effect of the solder portion.

PRIOR ART DOCUMENT

Patent Literature

Patent Literature 1: JP-A-2013-58605

BRIEF SUMMARY

Technical Problem

However, there are cases where the electronic component mounting machine cannot read the solder paste mark due to a print defect of the solder paste mark, or the like. In this case, the mounting position of the electronic component cannot be determined with reference to the solder paste mark. Therefore, conventionally, when the electronic component mounting machine cannot automatically read the solder paste mark, an operator manually specifies the solder paste mark of a print defect while viewing an image of the substrate. Then, the mounting position of the electronic component is determined with reference to the solder paste mark. However, in this case, if the skill level of an operator is low, the accuracy of mounting the electronic component becomes low. In addition, a solder portion having a shape similar to that of the solder paste mark may be printed on the substrate adjacent to the solder paste mark of a print defect. In this case, if the skill level of a worker is low, the worker may misrecognize the solder portion for the solder paste mark. As a result, the accuracy of mounting the electronic component is lowered. Therefore, an object of the disclosure is to provide an electronic component mounting machine and a production line having high accuracy of mounting an electronic component.

Solution to Problem

In order to solve the above problems, an electronic component mounting machine according to the disclosure includes: an image-capturing device that captures images of a sub-fiducial mark, being disposed on a substrate, and a main fiducial mark of which imaging position is determined with reference to the sub-fiducial mark; and a control device that determines a mounting position of an electronic component with respect to the substrate with reference to the main fiducial mark when the main fiducial mark can be read from an image captured by the image-capturing device, while determines the mounting position with reference to the sub-fiducial mark, which is a reference source of the main fiducial mark, when the main fiducial mark cannot be read from the image due to a print defect of the main fiducial mark. Here, the "print defect" is a defect related to a defect at the time of printing the main fiducial mark, such as blur, chipping, bleeding, distortion, or the like.

In order to solve the above problems, a production line according to the disclosure is a production line in which a plurality of the electronic component mounting machines are provided from an upstream toward a downstream in a transport direction of the substrate, wherein the control device of the electronic component mounting machine disposed at an upstream end in the transport direction transmits information related to the main fiducial mark, which cannot be read, to an electronic component mounting machine at the downstream in the transport direction when the main fiducial mark cannot be read from the image.

Advantageous Effects

According to the electronic component mounting machine of the disclosure, the mounting position of an electronic component can be determined with reference to the main fiducial mark in principle and with reference to the sub-fiducial mark exceptionally. That is, when the main fiducial mark cannot be read, the control device automatically determines the mounting position of the electronic component (specifically, the electronic component of which the mounting position is determined with reference to the main fiducial mark which was not originally read) with reference to the sub-fiducial mark which is the reference source of the main fiducial mark. Therefore, even when the main fiducial mark cannot be read, the production of the substrate can be automatically continued. Further, according to the electronic component mounting machine of the disclosure, even when the control device cannot read the main fiducial mark from the image, a manual operation of an operator (an operation of specifying the main fiducial mark of a print defect while viewing the image) does not intervene. Therefore, the accuracy of mounting the electronic component is high.

In this manner, according to the production line of the disclosure, the electronic component mounting machine at the downstream in the transport direction can recognize the unreadable main fiducial mark by the information transmitted from the electronic component mounting machine on the upstream end in the transport direction. Therefore, the electronic component mounting machine at the downstream in the transport direction can skip reading of the unreadable main fiducial mark. Therefore, it is possible to reduce the number of steps for reading the marks in the electronic component mounting machine at the downstream in the transport direction.

DESCRIPTION OF EMBODIMENT

Hereinafter, an embodiment of an electronic component mounting machine and a production line according to the disclosure will be described.

<Configuration of Production Line>

Figure 1:
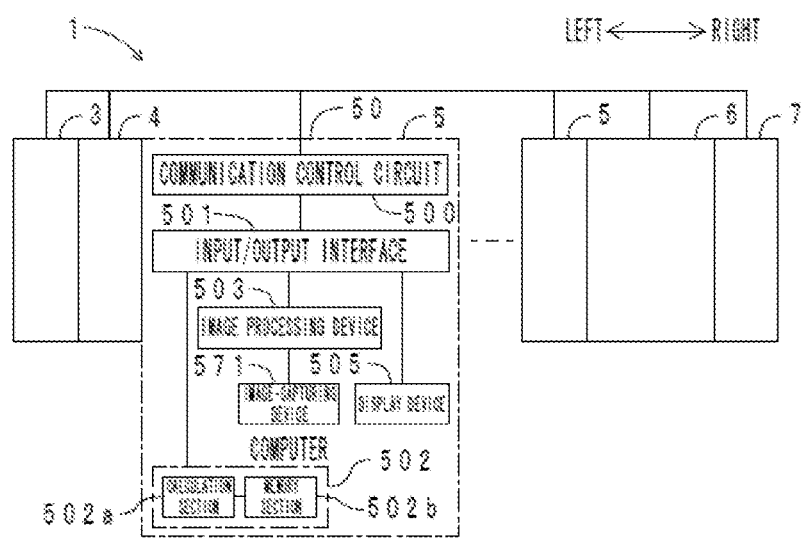
FIG. 1 is a schematic diagram of a production line according to an embodiment of the disclosure.

First, the configuration of the production line according to the embodiment will be described. FIG. 1 is a schematic diagram of the production line according to the embodiment. As shown in FIG. 1, the production line 1 includes a solder printing machine 3, a solder printing inspection machine 4, a plurality of electronic component mounting machines 5, a reflow furnace 6, and a substrate appearance inspection machine 7 from the left side (upstream in a transport direction) toward the right side (at downstream in the transport direction). These devices are communicatively connected.

Figure 2:
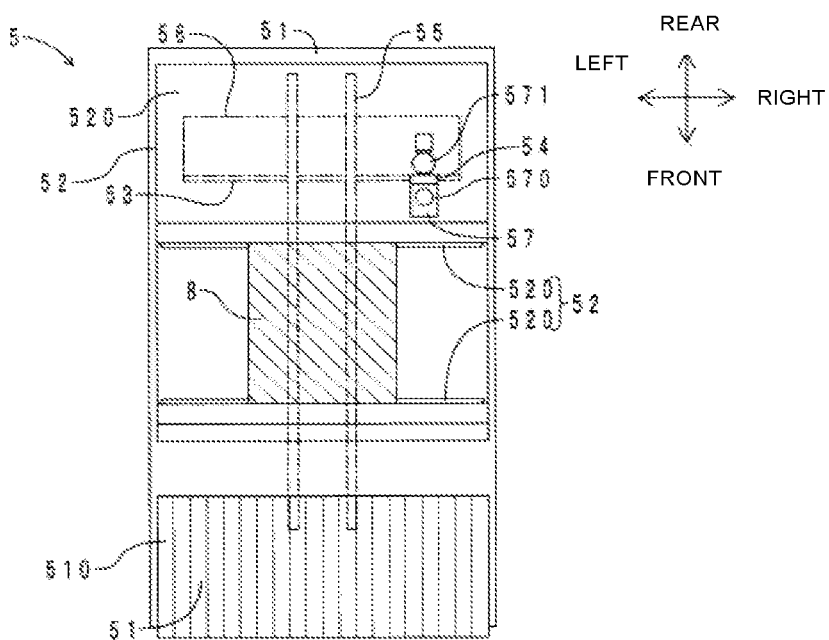
FIG. 2 is a top view of an electronic component mounting machine according to the embodiment of the disclosure.

FIG. 2 is a top view of the electronic component mounting machine according to the embodiment. The configuration of a plurality of the electronic component mounting machines 5 is the same. As shown in FIGS. 1 and 2, the electronic component mounting machine 5 includes a control device 50, a component supply device 51, a substrate transport device 52, a pair of upper and lower X-axis guide rails 53, an X-axis slide 54, a pair of left and right Y-axis guide rails 55, a Y-axis slide 56, and a mounting head 57.

As shown in FIG. 2, the component supply device 51 includes multiple tapes 510. The tape 510 accommodates electronic components. The substrate transport device 52 includes a pair of front and rear conveyor belts 520. A substrate 8 is conveyed from the left side toward the right side by the pair of front and rear conveyor belts 520. The pair of left and right Y-axis guide rails 55 are disposed on an upper wall of a housing (not shown) of the electronic component mounting machine 5. The Y-axis slide 56 is attached to the pair of left and right Y-axis guide rails 55 so as to be slidable in the front-rear direction. The pair of upper and lower X-axis guide rails 53 are disposed on the Y-axis slide 56. The X-axis slide 54 is attached to the pair of upper and lower X-axis guide rails 53 so as to be slidable in the left-right direction. The mounting head 57 is attached to the X-axis slide 54. Therefore, the mounting head 57 is movable back and forth, left and right. The mounting head 57 includes a suction nozzle 570 and an image-capturing device 571. The suction nozzle 570 is capable of transporting electronic components from the component supply device 51 to the substrate 8. The image-capturing device 571 is a CCD (Charge-Coupled Device) camera. The image-capturing device 571 is capable of imaging the upper surface of the substrate 8.

As shown in FIG. 1, the control device 50 includes a communication control circuit 500, an input/output interface 501, a computer 502, an image processing device 503, and a display device 505. The input/output interface 501 is connected to the communication control circuit 500, the computer 502, the image processing device 503, and the display device 505. The communication control circuit 500 is connected to other devices constituting the production line 1. The computer 502 includes a calculating section 502a and a memory section 502b. In the memory section 502b, data relating to wiring patterns, substrate marks, solder portions, solder paste marks, positions and shapes of electronic components, and the like, which will be described later, is stored in advance. The image processing device 503 is connected to the image-capturing device 571. The display device 505 is a touch screen (not shown). An operator can visually recognize information displayed on the display device 505. Further, an operator can input an instruction to the display device 505.

<Substrate Production Method>

Figure 3:
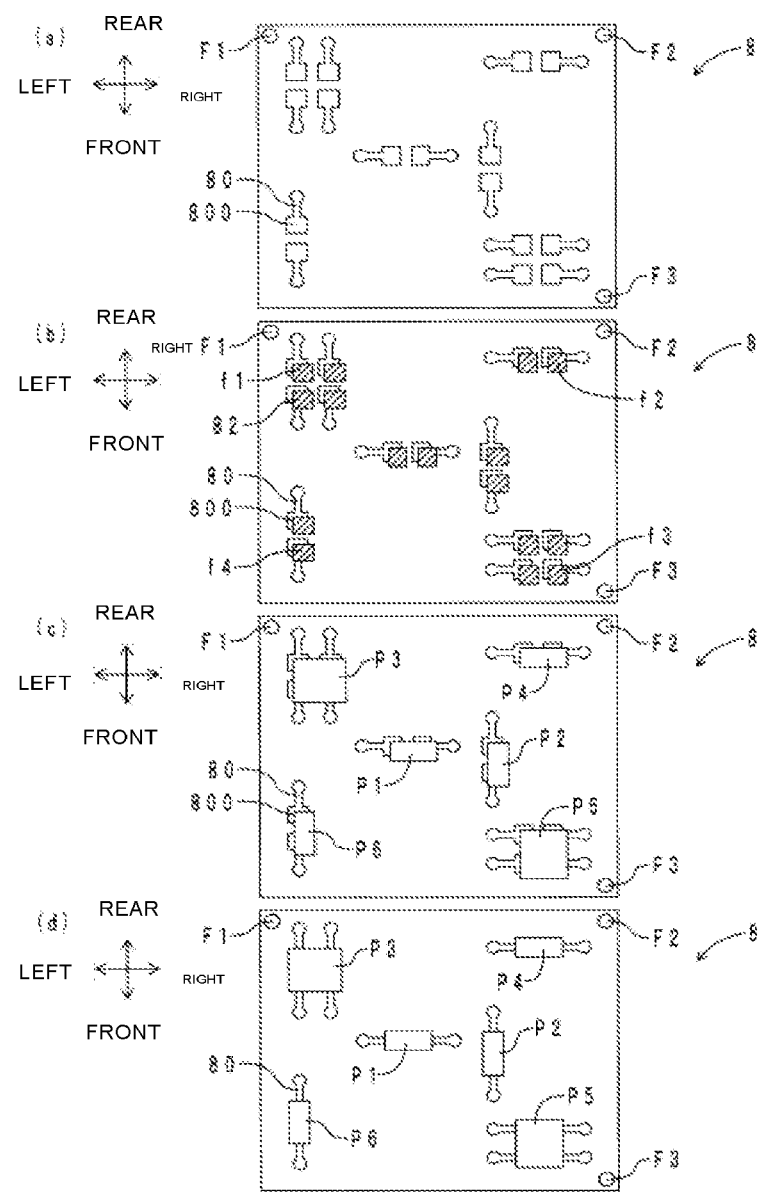
FIG. 3A is a top view of a substrate before being carried into a solder printing machine.
FIG. 3B is a top view of the substrate after being carried out from the solder printing machine.
FIG. 3C is a top view of the substrate after being carried out from the electronic component mounting machine.
FIG. 3D is a top view of the substrate after being carried out from a reflow furnace.

Next, a substrate production method executed by the production line according to the embodiment will be described. FIG. 3A shows a top view of a substrate before being carried into the solder printing machine. FIG. 3B shows a top view of the substrate after being carried out from the solder printing machine. FIG. 3C shows a top view of the substrate after being carried out from the electronic component mounting machine. FIG. 3D shows a top view of the substrate after being carried out from the reflow furnace. FIG. 3B to FIG. 3D show the case where a printed state of solder portions 82 in the solder printing machine 3 shown in FIG. 1 is acceptable.

As shown in FIG. 3A, a plurality of wiring patterns 80 and a plurality of substrate marks F1 to F3 are already printed on the substrate 8 before the substrate is carried into the solder printing machine 3 shown in FIG. 1. The wiring patterns 80 include land portions 800. The plurality of wiring patterns 80 and the plurality of substrate marks F1 to F3 are printed at the same time. Therefore, the plurality of wiring patterns 80 and the plurality of substrate marks F1 to F3 are arranged in the same coordinate system.

As shown in FIG. 3B, a plurality of the solder portions 82 are printed on the substrate 8 after the substrate is carried out from the solder printing machine 3 shown in FIG. 1. Of the plurality of solder portions 82, predetermined solder portions 82 are used as solder paste marks f1 to f4. The plurality of solder portions 82 are printed simultaneously by the same screen mask. Therefore, the plurality of solder portions 82 and the plurality of solder paste marks f1 to f4 are arranged in the same coordinate system. As shown in an exaggerated manner in FIG. 3B, the solder portions 82 (including the solder paste marks f1 to f4) are printed to be deviated from the land portions 800. However, the printed state of all the solder paste marks f1 to f4 is acceptable.

As shown in FIG. 3C, a plurality of electronic components P1 to P6 are mounted on the substrate 8 after the substrate passes through all the electronic component mounting machines 5 shown in FIG. 1. The mounting positions of all the electronic components P1 to P6 are determined with reference to the solder paste marks f1 to f4 in which the printed state is acceptable. Therefore, the plurality of electronic components P1 to P6 are accurately mounted with respect to the solder portions 82. On the other hand, the plurality of electronic components P1 to P6 and the solder portions 82 are arranged to be deviated from the land portions 800.

As shown in FIG. 3D, in the substrate 8 after being carried out from the reflow furnace 6 shown in FIG. 1, the deviation of the plurality of electronic components P1 to P6 and the solder portions 82 with respect to the land portions 800 is eliminated by the self-alignment effect described above. That is, the plurality of electronic components P1 to P6 and the solder portions 82 are accurately arranged with respect to the land portions 800.

<Mounting Position Determination Method>

Next, a mounting position determination method executed in the substrate production method will be described. The mounting position determination method is executed when the mounting positions of the electronic components P1 to P6 shown in FIG. 3D are determined in the electronic component mounting machine 5 shown in FIG. 1.

Figure 4:
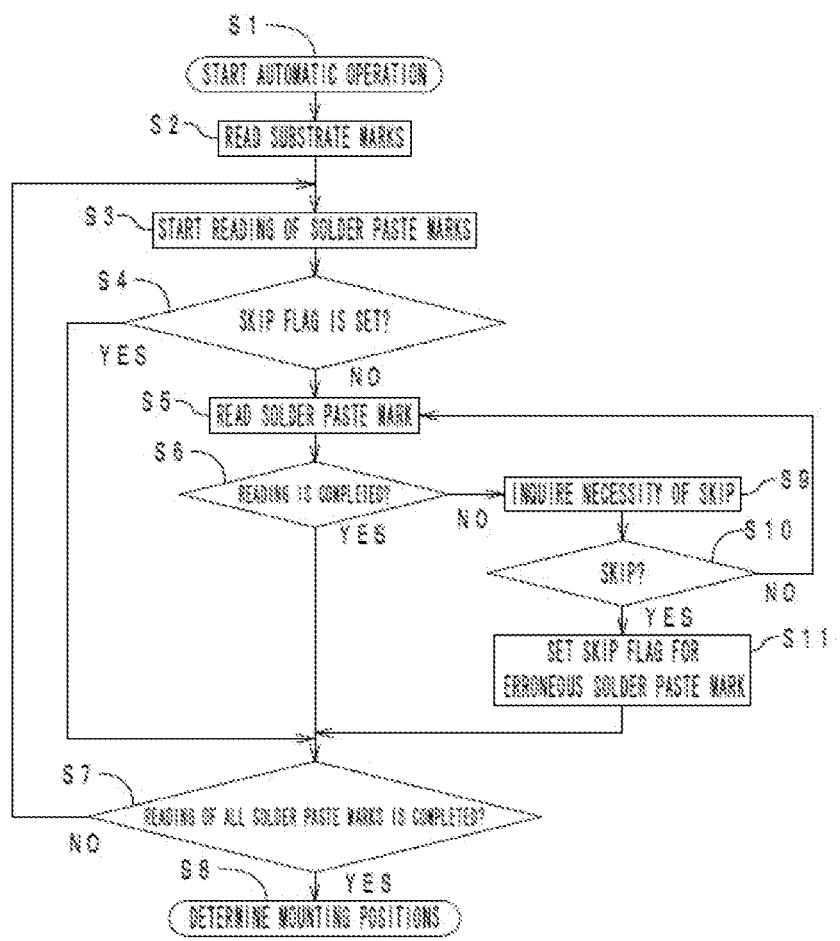
FIG. 4 is a flowchart of a mounting position determination method.

FIG. 4 shows a flowchart of the mounting position determination method. FIG. 5A shows a top view of the substrate after being carried out from the solder printing machine. FIG. 5B shows a top view of the substrate after being carried out from the electronic component mounting machine at the upstream end in the transport direction. FIG. 6 shows a skip necessity inquiry screen.

FIG. 5A corresponds to FIG. 3B, and FIG. 5B corresponds to FIG. 3C. FIG. 5A and FIG. 5B show a case where the printed state of the solder portion 82 in the solder printing machine 3 is poor.

As shown in FIG. 4, the mounting position determination method includes a substrate mark reading step (S2 (step 2, the same applies hereinafter) in FIG. 46), a skip flag confirmation step (S4 in FIG. 4), a solder paste mark reading step (S5 in FIG. 4), and a skip necessity determination step (S9 to S11 in FIG. 4).

[In the Case of the Electronic Component Mounting Machine at the Upstream End (First) in the Transport Direction]

In the first electronic component mounting machine 5, the electronic components P1 and P2 among the electronic components P1 to P6 shown in FIG. 3D are mounted at predetermined positions on the substrate 8. As shown in FIG. 4, the image-capturing device 571 of the first electronic component mounting machine 5 shown in FIG. 1 may firstly capture the images of the substrate marks F1 to F3 after an automatic operation is started (S1 in FIG. 4). The image processing device 503 processes the images of the substrate marks F1 to F3. The computer 502 reads the substrate marks F1 to F3 from the processed images (S2 in FIG. 4).

Next, the first electronic component mounting machine 5 starts capturing the images of and reading of the solder paste marks f1 to f4 (S3 in FIG. 4). The solder portions 82 used as the solder paste marks f1 to f4 are determined in advance. The electronic component mounting machine 5 executes reading of the solder paste marks f1 to f4 in a predetermined order (in the order of f1→f2→f3→f4 in this example).

The computer 502, referring to the data stored in the memory section 502b, checks whether or not a skip flag is set for the solder paste mark f1 (S4 in FIG. 4). Here, the skip flag is set by the first electronic component mounting machine 5. Thus, in the first electronic component mounting machine 5, the solder paste marks f1 to f4 on which the skip flag is set are not confirmed.

Subsequently, the image-capturing device 571 captures the image of the solder paste mark f1. The positions of the solder paste marks f1 to f4 to be image-captured are each determined with reference to the substrate marks F1 to F3 that have been read in the substrate mark reading step (S2 in FIG. 4).

The image processing device 503 processes an image of the solder paste mark f1. The computer 502 reads the solder paste mark f1 from the processed image (S5 in FIG. 4). Then, the computer 502 determines whether or not the solder paste mark f1 has been read (S6 in FIG. 4). As shown in FIG. 5A, the printed state of the solder paste mark f1 is acceptable. Therefore, the computer 502 can read the solder paste mark f1.

In this case, the electronic component mounting machine 5 starts reading the solder paste mark f2, which is the next reading target (S7 and S3 in FIG. 4). Like the solder paste mark f1, the electronic component mounting machine 5 checks the skip flag of the solder paste mark f2 (S4 in FIG. 4), and captures the images of and executing reading of the solder paste mark f2 (S5 in FIG. 4). Then, the computer 502 determines whether or not the solder paste mark f2 has been read (S6 in FIG. 4).

Here, as shown by a dotted line in FIG. 5A, the solder paste mark f2 is printed blurred. Printing blur is included in the concept of a "print defect" of the disclosure. Therefore, the computer 502 cannot read the solder paste mark f2. In this case, as shown in FIG. 6, the display device 505 displays the skip necessity inquiry screen (S9 in FIG. 4). As shown in FIG. 6, an inquiry message 505b about the necessity of skip, a skip determination button 505c, and a skip cancel button 505d are displayed on a screen 505a of the display device 505.

An operator who visually recognizes the inquiry message 505b checks the image of the solder paste mark f2 through the screen of the display device 505. Here, if the operator determines that "the printed state of the solder paste mark f2 is acceptable", the operator corrects data related to the solder paste mark f2 via the screen of the display device 505. Then, the operator touches the skip cancel button 505d (S10 in FIG. 4). That is, when the computer 502 cannot read the solder paste mark f2 even though the printed condition of the solder paste mark f2 is acceptable, it is assumed that there is some defect in the data related to the solder paste mark f2 in the memory section 502b (for example, an input error). Therefore, the operator checks the data, corrects the defect, and touches the skip cancel button 505d. Then, the computer 502 reads the solder paste mark f2 again (S5 in FIG. 4).

However, as shown by a dotted line in FIG. 5A, in this example, the solder paste mark f2 is blurry. For this reason, the operator who has checked the image of the solder paste mark f2 touches the skip determination button 505c (S10 in FIG. 4). Then, the computer 502 sets a skip flag for the solder paste mark f2 that cannot be read (S11 in FIG. 4). The information (skip flag) relating to the solder paste mark f2 is transmitted to the control device 50 of the electronic component mounting machine 5 on the downstream (subsequent) side in the transport direction shown in FIG. 1. The skip flag is stored in the memory section 502b of the subsequent electronic component mounting machine 5.

Subsequently, the electronic component mounting machine 5 reads the solder paste mark f3 (S7→S3→S4→S5→S6 in FIG. 4), and finally reads the solder paste mark f4 (S7→S3→S4→S5→S6 in FIG. 4). When the reading of all the solder paste marks f1 to f4 is completed (S7 in FIG. 4), as shown in FIG. 5B, the computer 502 of the first electronic component mounting machine determines the mounting positions of the electronic components P1 and P2 to be mounted by the electronic component mounting machine 5 (S8 in FIG. 4).

The computer 502 determines the mounting position of the electronic component P1 with reference to the solder paste marks f1 and f3 in principle and with reference to the substrate marks F1 to F3 exceptionally. In addition, the mounting position of the electronic component P2 is determined with reference to the solder paste marks f2 and f4 in principle and with reference to the substrate marks F1 to F3 exceptionally.

Hereinafter, a method of determining the mounting position of the electronic component P1 will be described as a representative example. When all of the solder paste marks f1 and f3 are read (S6 in FIG. 4), the computer 502 determines the mounting position of the electronic component P1 with reference to the two solder paste marks f1 and f3 at the diagonal positions. That is, the mounting position of the electronic component P1 stored in advance in the memory section 502b is corrected based on the deviation between the positions of the solder paste marks f1 and f3 stored in advance in the memory section 502b and the positions of the solder paste marks f1 and f3 actually read.

On the other hand, when at least one of the solder paste marks f1 and f3 cannot be read (S6 in FIG. 4), the computer 502 determines the mounting position of the electronic component P1 with reference to the substrate marks F1 to F3, which are reference sources of the capturing-image positions of the solder paste marks f1 and f3. That is, the mounting position of the electronic component P1 stored in advance in the memory section 502b is corrected based on the deviation between the positions of the substrate marks F1 to F3 stored in advance in the memory section 502b and the positions of the substrate marks F1 to F3 actually read. As described above, the computer 502 determines the mounting position of the electronic component P1 with reference to the solder paste marks f1 and f3 in principle and with reference to the substrate marks F1 to F3 exceptionally. The same applies to the electronic component P2.

In this example, since the solder paste marks f1 and f3 can be read, the computer 502 determines the mounting position of the electronic component P1 with reference to the solder paste marks f1 and f3. On the other hand, since the solder paste mark f2 cannot be read, the computer 502 determines the mounting position of the electronic component P2 with reference to the substrate marks F1 to F3.

Thereafter, the suction nozzle 570 shown in FIG. 2 mounts the electronic components P1 and P2 at the determined mounting coordinates. As shown in FIG. 5B, the electronic component P1 is accurately mounted on the solder portions 82. On the other hand, the electronic component P2 is accurately mounted on the land portions 800.

[In the case of the electronic component mounting machine on the downstream (subsequent) side in the transport direction] Also in the subsequent electronic component mounting machine 5 shown in FIG. 1, the mounting position determination method shown in FIG. 4 is executed in the same manner as the first electronic component mounting machine 5. However, the skip flag for the unreadable solder paste mark f2 has already been transmitted from the first electronic component mounting machine 5 to the subsequent electronic component mounting machine 5. The computer 502 of the subsequent electronic component mounting machine 5 confirms the skip flag in the skip flag confirmation step (S4 in FIG. 4). For this reason, the computer 502 skips the imaging and reading of the solder paste mark f2. That is, in the subsequent electronic component mounting machine 5, imaging and reading are performed in the order of the solder paste marks f1→f3→f4. Note that the computer 502 of the subsequent electronic component mounting machine 5 determines the mounting position of the electronic component, which is scheduled to be determined with reference to the solder paste mark f2, with reference to the substrate marks F1 to F3.

<Effects>

Next, the effects of the electronic component mounting machine and the production line according to the embodiment will be described. As shown in FIGS. 5A and 5B, according to the electronic component mounting machine 5 of the embodiment, the mounting positions of the electronic components P1 and P2 can be determined with reference to the solder paste marks f1 to f4 in principle and the substrate marks F1 to F3 exceptionally. That is, as shown in FIG. 4, when the solder paste mark f2 cannot be read, the control device 50 automatically determines the mounting position of the electronic component P2 (specifically, the electronic component P2 of which the mounting position is determined with reference to the solder paste mark f2 which was not originally read) with reference to the substrate marks F1 to F3 that are the reference sources of the imaging position of the solder paste mark f2. Therefore, even when the solder paste mark f2 cannot be read, the production of the substrate 8 can be automatically continued. Further, according to the electronic component mounting machine 5 of the embodiment, even when the control device 50 cannot read the solder paste mark f2 from the image, the manual operation of an operator (the operation of specifying the solder paste mark f2 of the print defect while viewing the image) does not intervene. Therefore, the accuracy of mounting the electronic component P2 is high.

Further, as shown in FIG. 1, according to the production line 1 of the embodiment, the subsequent electronic component mounting machine 5 can recognize the unreadable solder paste mark f2 by the information (skip flag) transmitted from the first electronic component mounting machine 5. Therefore, the subsequent electronic component mounting machine 5 can skip the imaging and reading of the unreadable solder paste mark f2. Therefore, in the subsequent electronic component mounting machine 5, it is possible to reduce the number of steps for imaging the marks and the number of steps for reading the marks.

Figure 5:
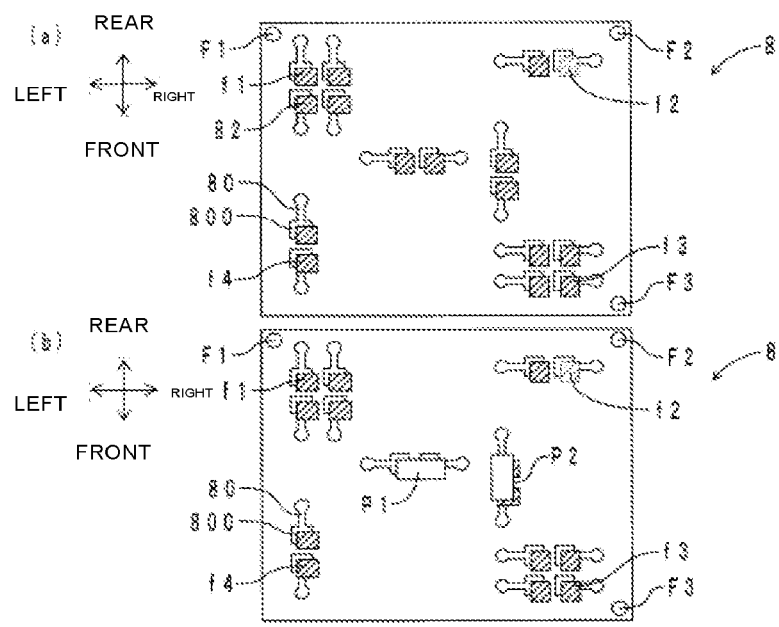
FIG. 5A is a top view of the substrate after being carried out from the solder printing machine.
FIG. 5B is a top view of the substrate after being carried out from the electronic component mounting machine at the upstream end in a transport direction.
Figure 6:
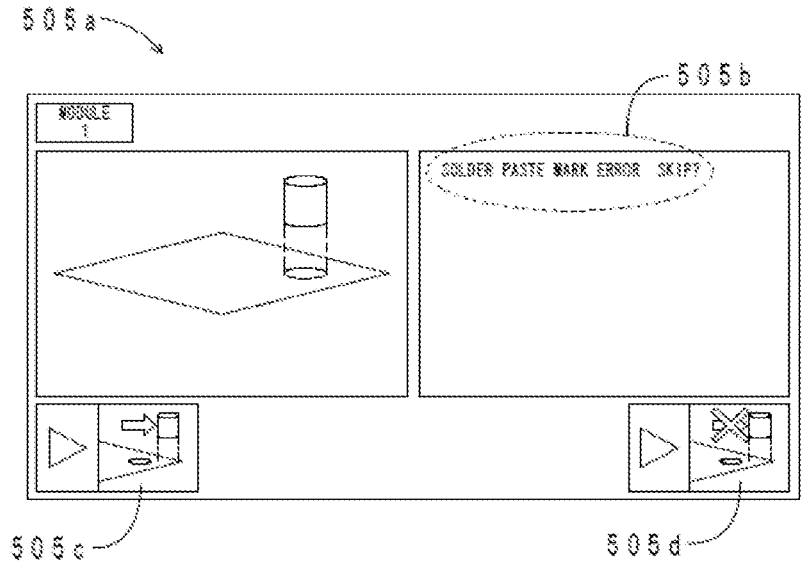
FIG. 6 is a skip necessity inquiry screen.

As shown in FIGS. 4 and 5, when the control device 50 cannot read the solder paste mark f2, the display device 505 of the first electronic component mounting machine 5 displays the inquiry message 505b. Therefore, an operator who visually recognizes the inquiry can check the cause why the solder paste mark f2 cannot be read. If the computer 502 is unable to read the solder paste mark f2 even though the printed condition of the solder paste mark f2 is acceptable, it is assumed that there is some defect in the data related to the solder paste mark f2 in the memory section 502b (for example, an input error). In this regard, since the display device 505 displays the inquiry message 505b, the operator can easily find and correct the defect.

<Other>

The embodiment of the electronic component mounting machine and the production line according to the disclosure has been described above. However, the embodiment is not particularly limited to the above embodiment. Various modifications and improvements that can be made by those skilled in the art are possible.

The solder paste marks f1 to f4 for determining the mounting positions of the electronic components P1 and P2 are not particularly limited. The mounting position of the electronic component P1 may be determined from at least one of the solder paste marks f1 to f4 on the substrate 8. The same applies to the electronic component P2. The solder paste marks f1 to f4 for determining the mounting positions of the plurality of electronic components P1 and P2 may be completely coincident with each other. Alternatively, only a part of the solder paste marks may be coincident with each other. Alternatively, the solder paste marks may be quite different from each other.

A single one of the solder paste marks f1 to f4 may be set based on the plurality of solder portions 82. For example, the center of gravity of an imaginary quadrangle formed by connecting the outer edges of the four solder portions 82 at the left rear corner of FIG. 5A may be set as the solder paste mark f1. In this case, when at least one of the four solder portions 82 has the print defect, the solder paste mark f1 (center of gravity) may be determined to be unreadable. If the center of gravity can be calculated, the solder paste mark f1 (center of gravity) may be determined to be readable. For the solder paste marks f1 to f4, solder portions 82 dedicated to marks may be used in addition to the solder portions 82 for bonding the electronic components. That is, the solder paste marks f1 to f4 may be in the same coordinate system as the solder portions 82.

The substrate marks F1 to F3 for determining the imaging positions of the solder paste marks f1 to f4 are not particularly limited. The mounting position of the solder paste mark f1 may be determined from at least one of the substrate marks F1 to F3. The same applies to the solder paste marks f2 to f4. The substrate marks F1 to F3 for determining the imaging positions of the plurality of solder paste marks f1 to f4 may be completely coincident with each other. Alternatively, only a part of the substrate marks may be coincident with each other. Alternatively, the solder paste marks may be quite different from each other. The land portions 800 may be used as the substrate marks F1 to F3. That is, the substrate marks F1 to F3 may be in the same coordinate system as the wiring patterns 80.

Types of marks for the main fiducial mark and the sub-fiducial mark are not particularly limited. For example, the type may be a character, a graphic, a symbol, a combination thereof, or the like. The numbers and the locations of the main fiducial marks and the sub-fiducial marks are not particularly limited. The type of the main fiducial mark is not particularly limited. The type of the main fiducial mark may be, in addition to the solder paste marks f1 to f4, a component mark (for example, a mark on an electronic component used for determining the mounting position when another electronic component is mounted on the upper surface of the electronic component) or the like.

The type of the substrate 8 is not particularly limited. For example, a plurality of divisible product substrates may be arranged on a single sheet substrate. In this case, the main fiducial mark may be disposed on at least one of the sheet substrate and the product substrate. The same applies to the sub-fiducial mark.

The type of the image-capturing device 571 is not particularly limited. The type may be a CMOS (Complementary Metal-Oxide Semiconductor) camera. The types, the arrangement, and the numbers of the devices constituting the production line 1 are not particularly limited. For example, the solder printing inspection machine 4 may not be arranged.

REFERENCE SIGNS LIST

1: production line 3: solder printing machine, 4: solder printing inspection machine, 5: electronic component mounting machine, 50: control device, 500: communication control circuit, 501: input/output interface, 502: computer, 502a: calculating section, 502b: memory section, 503: image processing device, 505: display device, 505a: screen, 505b: inquiry message, 505c: skip determination button, 505d: skip cancel button, 51: component supply device, 510: tape, 52: substrate transport device, 520: conveyor belt, 53: X-axis guide rail, 54: X-axis slide, 55: Y-axis guide rail, 56: Y-axis slide, 57: mounting head, 570: suction nozzle, 571: image-capturing device, 6: reflow furnace, 7: substrate appearance inspection machine, 8: substrate, 80: wiring pattern, 800: land portion, 82: solder portion, F1 to F3: substrate mark, P1 to P6: electronic component, f1 to f4: solder paste mark

The invention claimed is:

1. An electronic component mounting machine comprising:
   an image-capturing device that captures images of a substrate that has a land portion disposed on the substrate, a solder portion disposed on the land portion, a substrate mark having a same coordinate system as the land portion, and a solder paste mark having a same coordinate system as the solder portion; and
   a control device configured to
      prior to mounting an electronic component on the substrate, determine a position of the solder paste mark with reference to the substrate mark,
      determine a mounting position of the electronic component to be mounted on the substrate with reference to the position of the solder paste mark when the solder paste mark is readable from an image captured by the image-capturing device, and
      determine the mounting position of the electronic component to be mounted on the substrate with reference to the substrate mark when the solder paste mark cannot be read from the image due to a print defect of the solder paste mark.

2. A production line in which a plurality of the electronic component mounting machines according to claim 1 are provided from an upstream toward a downstream in a transport direction of the substrate, wherein
   the control device of an electronic component mounting machine at an upstream end in the transport direction transmits information related to the solder paste mark, which cannot be read, to an electronic component mounting machine downstream in the transport direction when the solder paste mark cannot be read from the image.

3. The production line according to claim 2, wherein
   the electronic component mounting machine at the upstream end in the transport direction includes a display device which displays inquires of an operator whether or not skipping of a reading operation is necessary when the control device cannot read the solder paste mark from the image.

* * * * *